United States Patent [19]
Mattei

[11] Patent Number: 5,522,132
[45] Date of Patent: Jun. 4, 1996

[54] MICROWAVE SURFACE MOUNT PACKAGE

[75] Inventor: Carmelo J. Mattei, Phoenix, Ariz.

[73] Assignee: St Microwave Corp., Arizona Operations, Chandler, Ariz.

[21] Appl. No.: 346,523

[22] Filed: Nov. 29, 1994

Related U.S. Application Data

[62] Division of Ser. No. 72,819, Jun. 7, 1993, Pat. No. 5,401,912.

[51] Int. Cl.$^6$ ........................................... H05K 3/02
[52] U.S. Cl. ........................... 29/846; 174/262; 257/728
[58] Field of Search .................... 174/250, 255, 174/262, 263, 264, 265, 266, 35 R, 35 GC, 52.1–52.4; 361/794, 813, 816, 818; 428/901; 29/825, 829, 846, 843; 257/728, 774

[56] References Cited

U.S. PATENT DOCUMENTS

| | | | |
|---|---|---|---|
| 4,287,772 | 9/1981 | Mounteer et al. | 73/720 |
| 4,644,096 | 2/1987 | Gutierrez et al. | 174/52.5 |
| 4,649,229 | 3/1987 | Scherer et al. | 257/708 |
| 4,812,895 | 3/1989 | Funck et al. | 357/69 |
| 4,990,720 | 2/1991 | Kaufman | 174/52.4 |
| 5,023,993 | 6/1991 | Fengelly | 29/843 |
| 5,117,068 | 5/1992 | Seieroe et al. | 174/52.4 |
| 5,326,937 | 7/1994 | Watanabe | 174/263 |
| 5,352,998 | 10/1994 | Tanino | 333/247 |
| 5,387,888 | 2/1995 | Eda et al. | 333/247 |

OTHER PUBLICATIONS

Robert J. DeBoo et al. *New Surface-Mounted Package Breaks from Traditional MIC Packaging*, Microwave Journal, Mar. 1984.

*Primary Examiner*—Kristine L. Kincaid
*Assistant Examiner*—Christopher Horgan
*Attorney, Agent, or Firm*—Bryan Cave; David M. Klein

[57] ABSTRACT

An improved surface mount package and method of making such a package is provided. A conventional surface mount package is modified by fabricating a U-shaped via around the lead via to form a quasi-coaxial transmission line through the insulating substrate. This permits the electrical impedance in the conductive elements of the surface mount package to be controlled to reduce insertion loss and return loss, and to improve isolation. The surface mount package includes a lead frame, and a gold plate to which an integrated circuit in the package is attached. The package is sealed with a ring-frame and a lid. Ground vias connecting the lead-frame to the plate through the substrate may also be included. The present package is designed by modelling the various elements of the package as a coaxial transmission line, a co-planar waveguide, and a single lead in a trough transmission line in combination. In an alternative embodiment, the U-shaped via may be formed of discrete holes drilled through the substrate, rather than as a continuous U-shape.

7 Claims, 9 Drawing Sheets

५,५२२,१३२

MICROWAVE SURFACE MOUNT PACKAGE

This is a divisional of U.S. application Ser. No. 08/072,819, filed Jun. 7, 1993 now U.S. Pat. No. 5,401,912.

BACKGROUND OF THE INVENTION

1. Field of the Invention

The present invention relates generally to surface mount packages for integrated circuits and more particularly to a surface mount package having a U-shaped via extending around the transmission via of the package substrate to allow the integrated circuit to be operated at higher microwave frequencies.

2. Description of the Prior Art

Surface mount packages, such as shown in Seieroe et al., U.S. Pat. No. 5,117,068, are readily known in the art. In general the purpose of such packages is to house integrated circuits in an environmentally protected enclosure, while at the same time providing electrical connections from the external package leads to the internal enclosed integrated circuit. As illustrated in FIGS. 1–4, a typical prior art surface mount package includes a lead-frame 2 which preferably matches the lead-frame of a conventional TO-8 package and includes outwardly extending leads 14 such as input, output and bias leads. A substrate 4, preferably of alumina, includes solid metal vias 6 extending therethrough which electrically connect the lead-frame 2 to an integrated circuit 8 mounted in the package. The lead-frame 2 and a seal-ring 10 are brazed to each face of the alumina base 4 in a brazing operation. After inserting the integrated circuit into the package, lid 12 is sealed to seal-ring 10 to complete the package.

The integrated circuit 8 is connected to the internal floor of the package by means of conductive epoxy or metal attach 16. Ground vias 18 are provided to electrically connect the internal ground plane 16 to the lead frame 2. Internal package leads 20, which are fabricated as part of the surface mount package make the electrical connections from the integrated circuit 8 to the lead vias 6. The metal filled vias 6 are connected to the external leads 14 during a braze operation.

As the AC frequency of the signal being sent to the IC through lead vias 6 increases beyond about 8 GHz in prior art surface mount packages, it has been found that the electrical losses and interference in the package increase beyond acceptable limits. This is so because, in microwave applications, the transmission medium and device interconnections introduce inductance and capacitance which degrade system performance. Accordingly, it is desirable to have a surface mount package suitable for frequencies beyond 8 GHz in which high frequency devices, such as cellular radio, may operate. Furthermore, it is desirable to have a method for increasing the usable frequency range of other types of integrated circuits.

SUMMARY OF THE INVENTION

The present invention is an improved system and method for reducing losses and interference in a surface mount package to make the package operable at frequencies up to 26 GHz and beyond with acceptable performance characteristics. Furthermore, the present invention is applicable for use in other types of circuits which employ a transmission lead passing through an insulating substrate.

In the present invention, the electrical impedance in the conductive elements of the surface mount package is controlled to reduce insertion loss, return loss, and to improve isolation. This is accomplished by fabricating a U-shaped via around the lead via in the surface mount package to form a quasi-coaxial transmission line through the insulating substrate. The substrate is coated on its top and bottom surfaces with a lead-frame and a plate to which an integrated circuit in the package is attached. Ground vias connecting the lead-frame to the plate through the substrate may also be provided.

To reduce losses and to improve isolation, the present package is designed using impedance matching techniques known in the art: The plate on top of the substrate and the lead via forming a coaxial transmission line; the lead frame and lead forming a co-planar waveguide; and within the substrate, the transmission via and U-shaped via forming a single lead in a trough transmission line. These elements are preferably designed to have an impedance of 50 ohms.

If desired, additional ground vias may be located in the substrate at various locations to limit ring-frame resonance effects. In an alternative embodiment, the U-shaped via may be formed by making discrete holes through the substrate in a U-shape.

Accordingly, the novel U-shaped via of the present invention provides a method whereby the usable frequency range of surface mount packages and other electrical device is increased.

DESCRIPTION OF THE PREFERRED EMBODIMENT

The present invention provides an improved system and method for reducing losses and interference in a surface mount package so as to make the package operable at frequencies up to 26 GHz and beyond. To operate at microwave frequencies, the electrical impedance in the electrical transmission lines of the present invention is controlled and the R.F. energy treated in a manner which is conducive to use at high microwave frequencies. With a typical four lead surface mount package such as shown in the prior art, three RF characteristics are important: Insertion Loss, Return Loss, and Isolation.

Figure 3:
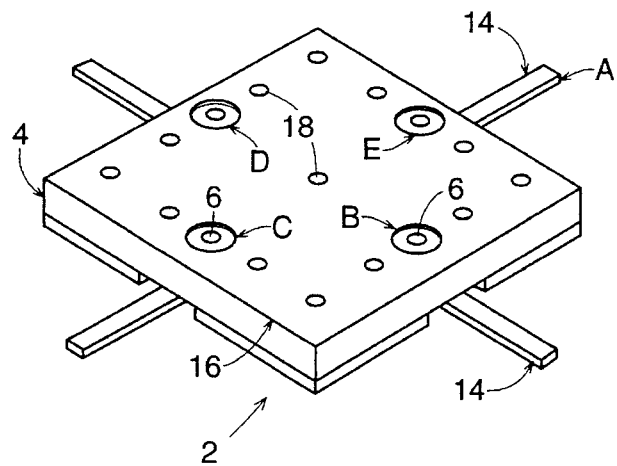
FIG. 3 shows a top view of a prior art surface mount package without a ring-frame.
Figure 4:
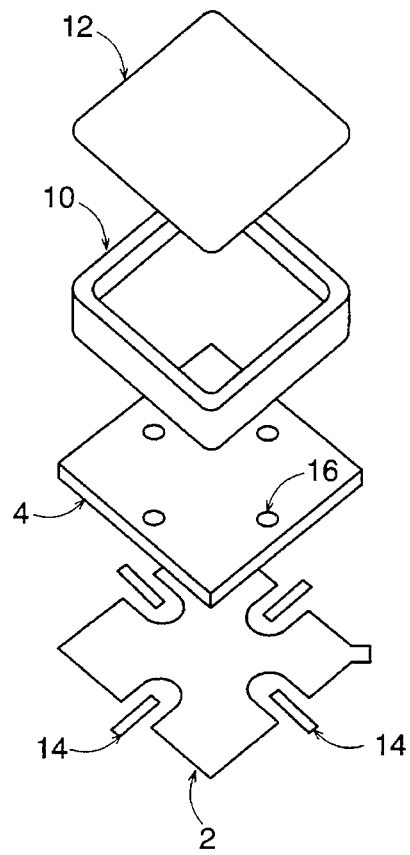
FIG. 4 shows an exploded perspective view of a prior art surface mount package.

Insertion Loss is the amount of energy lost resulting from the transmission of RF energy. As shown in FIG. 3, this loss would be measured from the external lead to the internal connection terminal, i.e., the loss resulting from RF transmission between points A and E. The main property affecting Insertion Loss is the electrical conductivity of the metals used for transmitting the AC signal. The lowest possible loss is desired.

Return Loss is the amount of energy returning back to the terminal from which the transmitted signal originated. In FIG. 3, energy transmitted from point A to point E and reflected back to point A would constitute Return Loss. Zero reflections would be ideal, however industry standards for acceptable levels have been established. To reduce Return Loss, it is preferable to create a 50 ohm transmission line from point A to point E.

Isolation is a measure of energy leakage from one lead to another. In FIG. 3, if an R.F. signal is transmitted through the lead at point A, it is desirable that no energy be present in leads B, C, or D resulting from the energy present in lead A. These losses may be minimized by containing the electromagnetic fields throughout the package, and especially through the lead vias 6.

Figure 1:
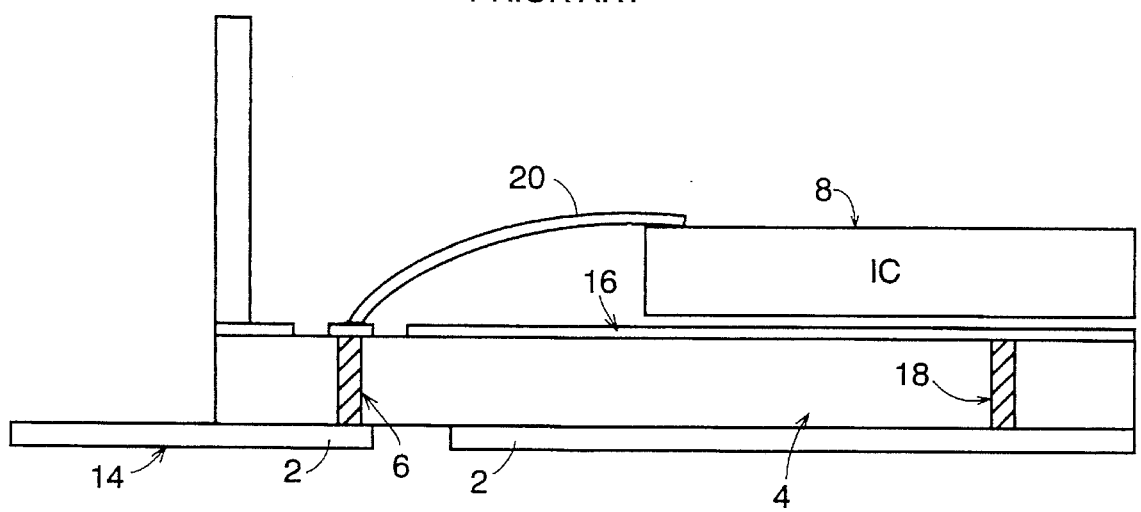
FIG. 1 shows a partial side view of a prior art surface mount package.
Figure 2:
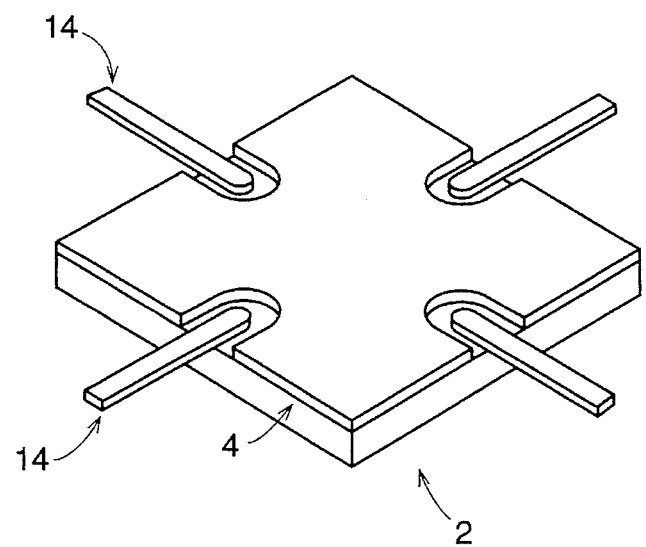
FIG. 2 shows a bottom view of a prior art surface mount package without a ring-frame.

Prior art surface mount packages experience high RF losses at frequencies past 8 GHz. While the bottom side (see FIG. 2) of prior art surface mount packages had been designed for 50 ohms using a co-planar waveguide medium for transmission which helps to reduce losses, once the R.F. signal enters the ceramic substrate 4, losses increase beyond acceptable limits. To an extent, these losses are believed to be caused by the impedance within the lead vias 6, and by the connections between the vias 6 and the leads 14 and IC 8. The impedance within these layers and at their barriers is controlled very little if at all in the prior art. Furthermore, the via structure created within the substrate can be viewed as a waveguide without sidewalls. Within this ceramic medium, several waveguide modes can be excited by the vertical metal filled via hole, which acts as an antenna. Poor isolation and multiple resonances are also believed to occur.

Figure 5:
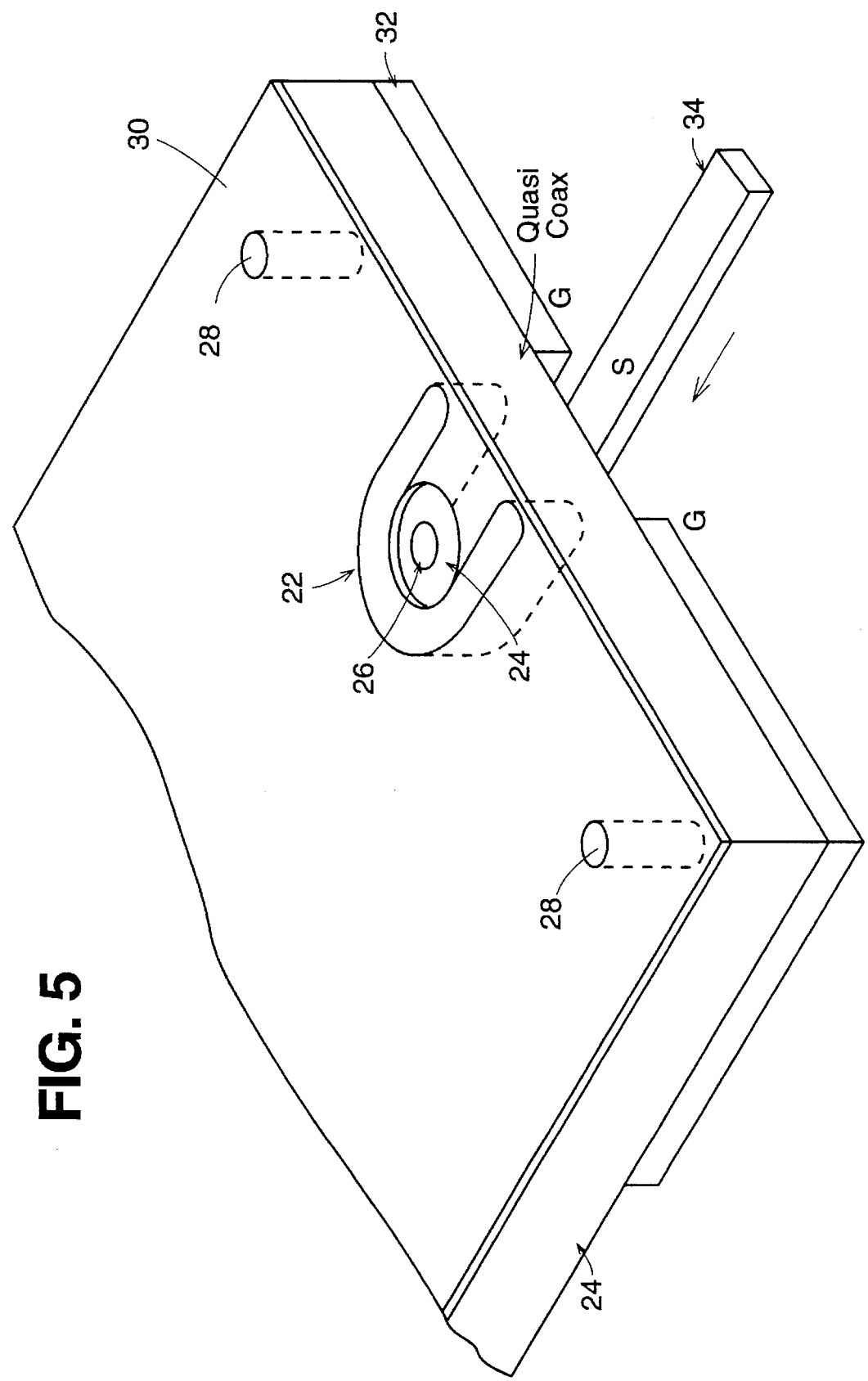
FIG. 5 shows a partial perspective view of the surface mount package of the present invention.
Figure 6:
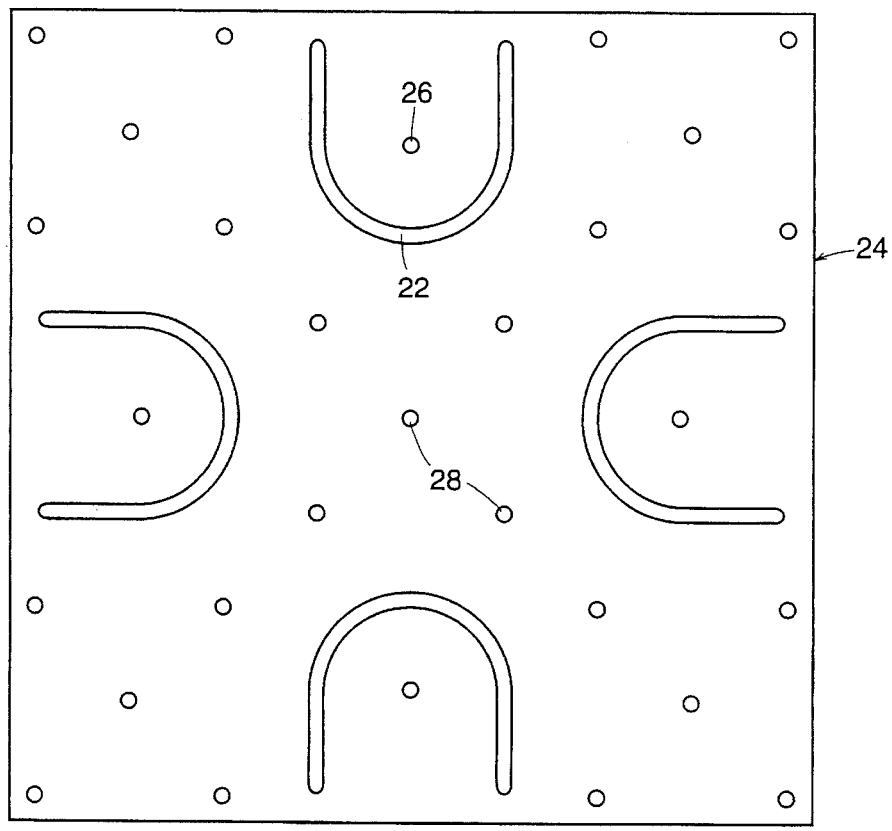
FIG. 6 shows a top view of the preferred embodiment of the surface mount package substrate of the present invention.

As shown in FIGS. 5 and 6, by the present invention, the via hole pattern in the ceramic substrate is modified to rectify the above-identified problems and to boost the useability of the package to 26 GHz and beyond, it being understood that FIG. 5 represents a partial view of one lead of a typical four lead package. The modification consists of forming a U-shaped metal filled via 22 around the signal via 26 to form a quasi-coaxial transmission line through substrate 24.

Substrate 24 is preferably fabricated of alumina or aluminum nitride by any technique readily known to those skilled in the art, although it is readily foreseen that the substrate 24 may be made of any readily known insulator suitable for use as an insulating substrate. Transmission vias 26, ground vias 28, and U-shaped vias 22 are preferably laser drilled through the substrate 24. The dimensions of the vias will vary to reduce losses based upon the design equations described below. The vias 22, 26, and 28 are filled with a metal having a high electrical conductivity and high thermal conductivity, preferably tungsten-copper or gold. The high electrical conductivity is preferable for reducing insertion and DC losses. High thermal conductivity is preferable to provide a thermal path through the vias and out of the package which is helpful for cooling the package. It is readily foreseen that vias 22, 26 and 28 may be metal-filled with various materials and through various techniques as are known in the art.

Substrate 24 is preferably coated on its top and bottom surfaces, preferably with two layers: a first layer of titanium-tungsten is preferably sputtered on the alumina or other insulator 24 to improve adherence of the second layer, which is preferably of sputtered gold. The integrated circuit to be mounted in the package preferably sits on the upper layer of gold 30. The layer of gold on the bottom of the substrate preferably forms a conventional lead-frame 32.

The present invention may be operated at higher frequencies than prior art devices by modelling the various components of the package and then designing each element so as to minimize losses. The present invention may be modelled as three discrete elements, cooperating to reduce losses:

[1] As shown in FIG. 5, at the top of substrate 24, the transmission via 26 and ground metal 30 form a coaxial transmission line. The coaxial transmission line is formed by the lead via 26, which is the inner conductive element, and the gold plate 30 on substrate 24, which completely surrounds the lead via 26 and is the outer element of the coaxial transmission line.

The coaxial portion of the present invention is preferably designed using the following equation which is readily known in the art, where D is the diameter of the outer conductor, d is the diameter of the inner conductor, and $\epsilon_r$ is the relative dielectric constant of the dielectric between the inner and outer conductors:

$$Z_0 = \frac{60}{\sqrt{\epsilon_r}} \ln\left(\frac{D}{d}\right)$$

As previously indicated, the preferred characteristic Impedance $Z_0$ for a coaxial transmission line is 50Ω. Accordingly, the dimensions of D and d may be determined from the following equation:

$$D = de\left[\frac{50\sqrt{\epsilon_r}}{60}\right]$$

[2] At the bottom of the package, where the lead 34 enters the lead frame 32 and contacts the transmission via 26, a co-planar waveguide is formed. The dimensions of the lead frame 32, the lead 34, the height of the substrate 24, and the spacing therebetween are preferably designed to minimize electrical losses and interference of a signal travelling through lead 34, and are further designed to match the impedance at the junction between lead 34 and transmission via 26. The equations for designing these elements are known in the art. These equations are complex and are preferably done using computer software specially designed for this purpose.

[3] Within the substrate, the transmission via 26 and U-shaped via 22 form a single lead in a trough transmission line. Accordingly, the dimensions of the various elements may be determined from the following equation which is known in the art, where w represents the inside width of the U-shaped via, h represents the distance between the inside lower edge of the U-shaped via 22 and the center of transmission via 26, $\epsilon_r$ is the relative dielectric constant of the dielectric 24, $Z_0$ is the characteristic impedance for the transmission line which is preferably is 50Ω, d is the width of the conductive via 26, and d <<h, w.

$$Z_0 = \left(\frac{138}{\epsilon^{1/2}}\right) \log\left(\frac{4w \tanh\left(\pi\frac{h}{w}\right)}{\pi d}\right)$$

This structure is preferably designed to have an impedance of 50 ohms. Preferably, transmission via 26 is centered with respect to the width w of U-shaped via 22.

Figure 7:
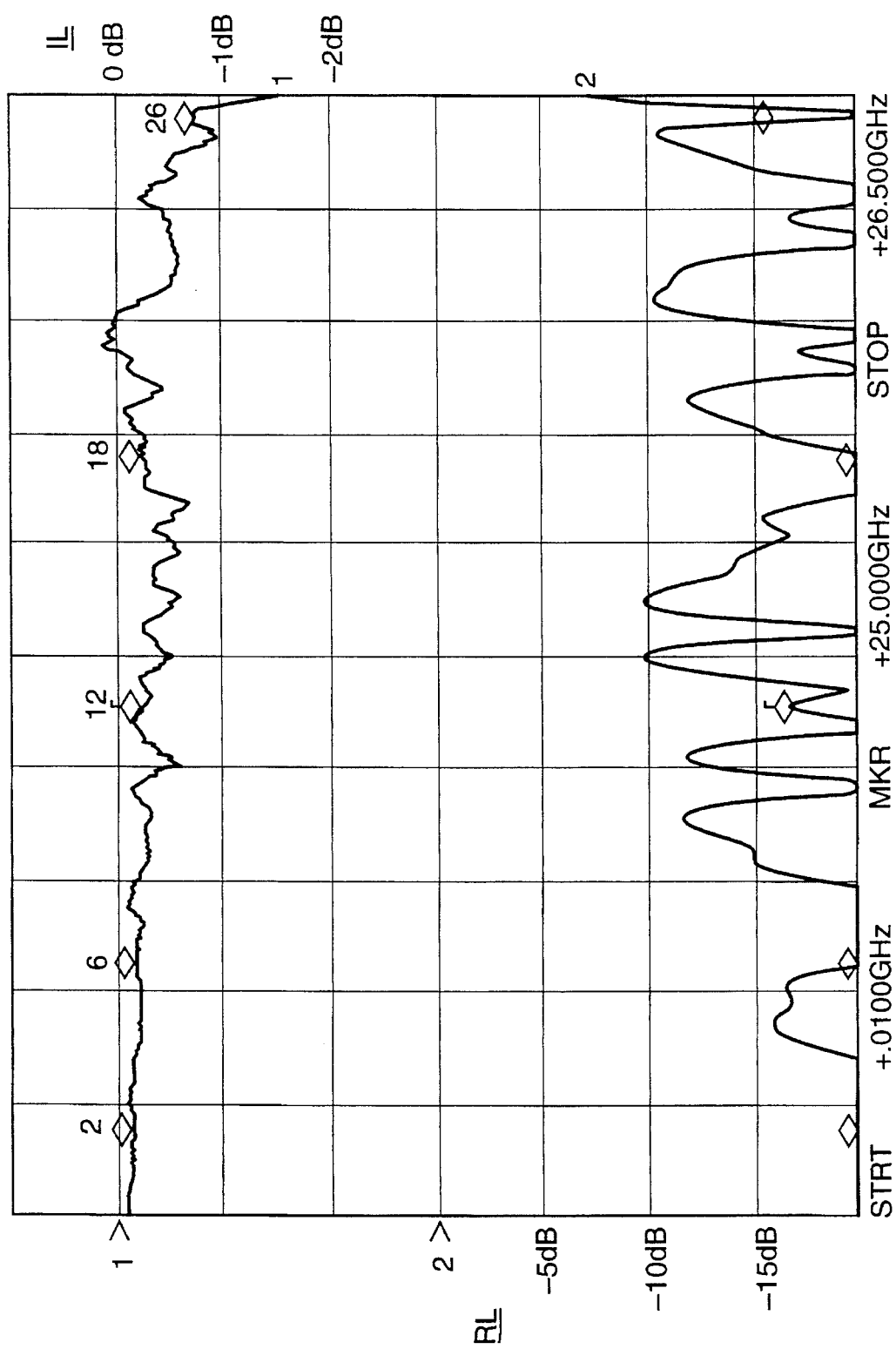
FIG. 7 shows the insertion and return loss performance of the embodiment of the present invention shown in FIG. 6.

FIG. 7 shows the insertion and return loss performance of the embodiment of the present invention shown in FIG. 6.

Figure 8:
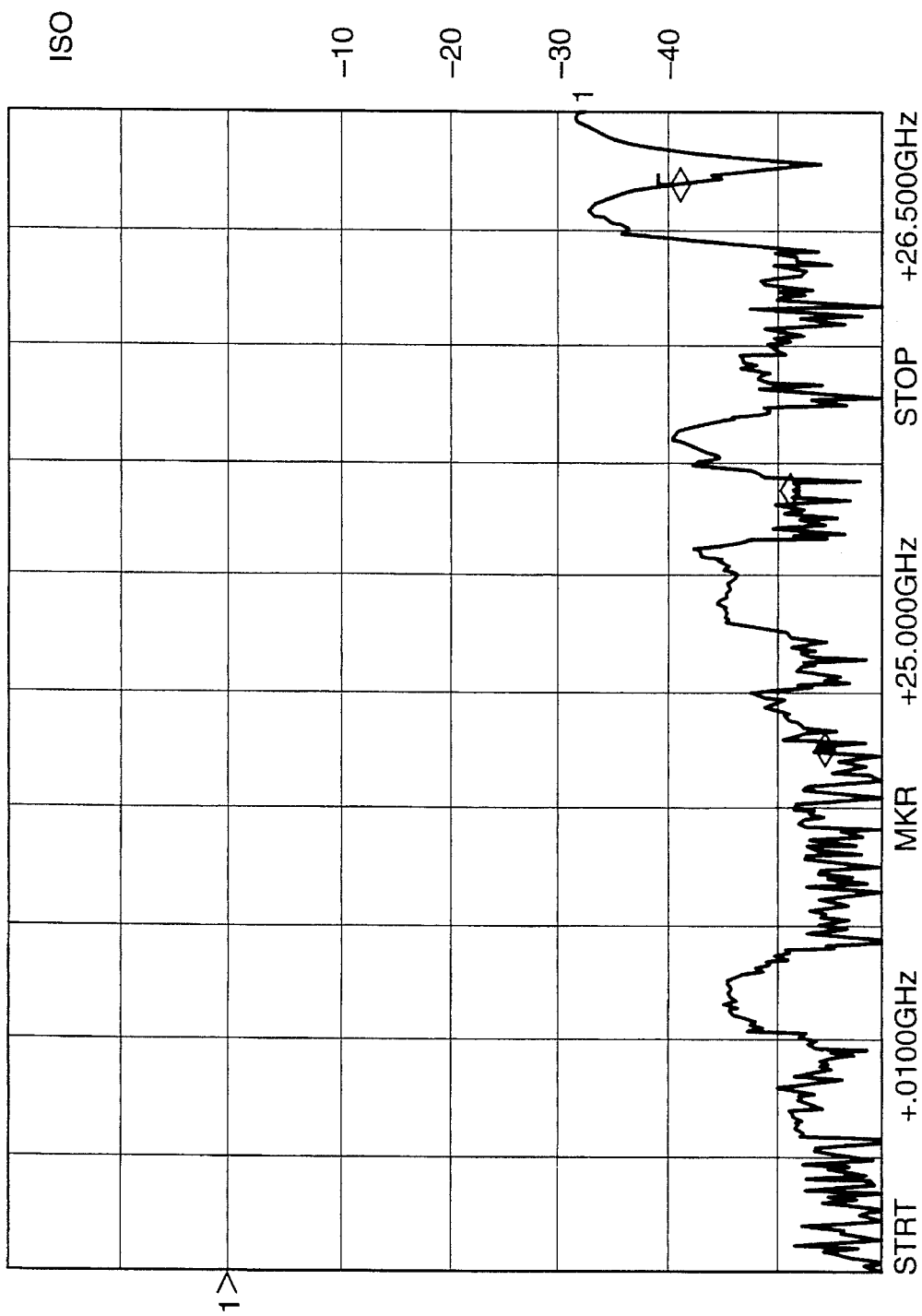
FIG. 8 shows the isolation performance of the embodiment of the present invention shown in FIG. 6.

FIG. 8 shows the isolation performance of the embodiment of the present invention shown in FIG. 6.

Figure 9:
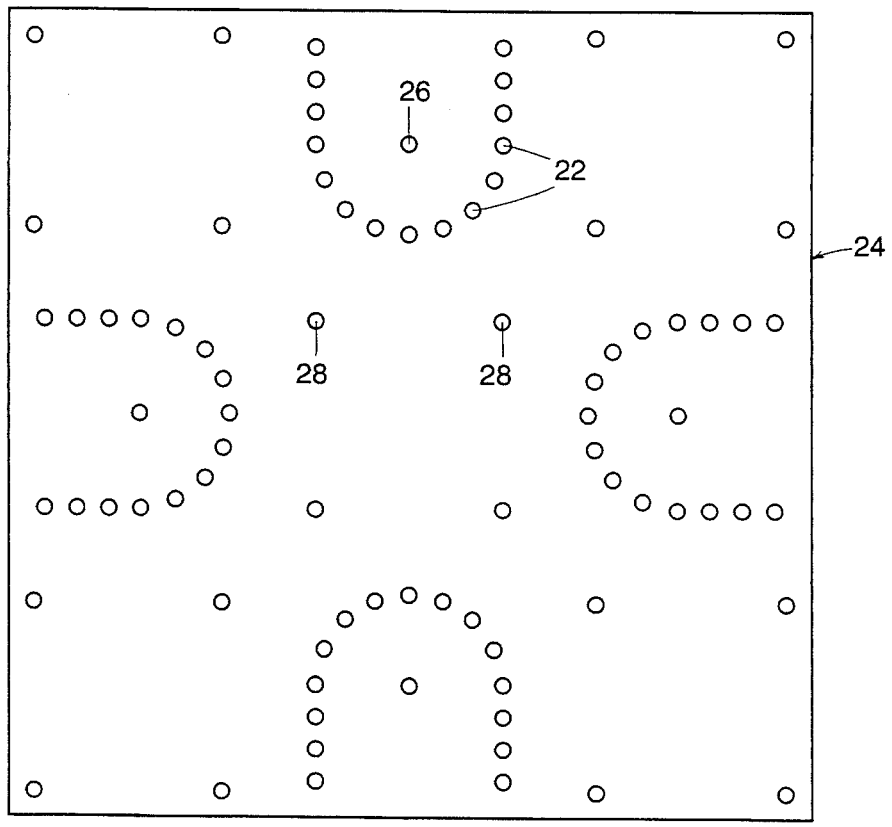
FIG. 9 shows a top view of an alternative embodiment of the surface mount package of the present invention, wherein the U-shaped via is non-continuous.

Accordingly, by the present invention the surface mount packages is designed as three distinct electrical elements which are matched to each other so as to reduce system losses. If desired, as shown in FIGS. 5, 6 and 9, ground vias 28 may be placed in the substrate 24 at locations around the vias 26 to limit potential ring-frame resonance effects. The U-shaped via 22 controls the impedance within the ceramic and contains the electromagnetic field within a localized area, thus reducing leakage to other leads. While it has been found that utilizing a U-shaped via 22 around transmission via 26 is preferred from a manufacturing standpoint, it is foreseen that the present invention may be modified so that via 22 extends completely around transmission via 26. In this embodiment, rather than modelling the transmission via 26 thorough the substrate 24 as a "single wire in a trough," it would be modelled as a true coaxial transmission line.

Figure 10:
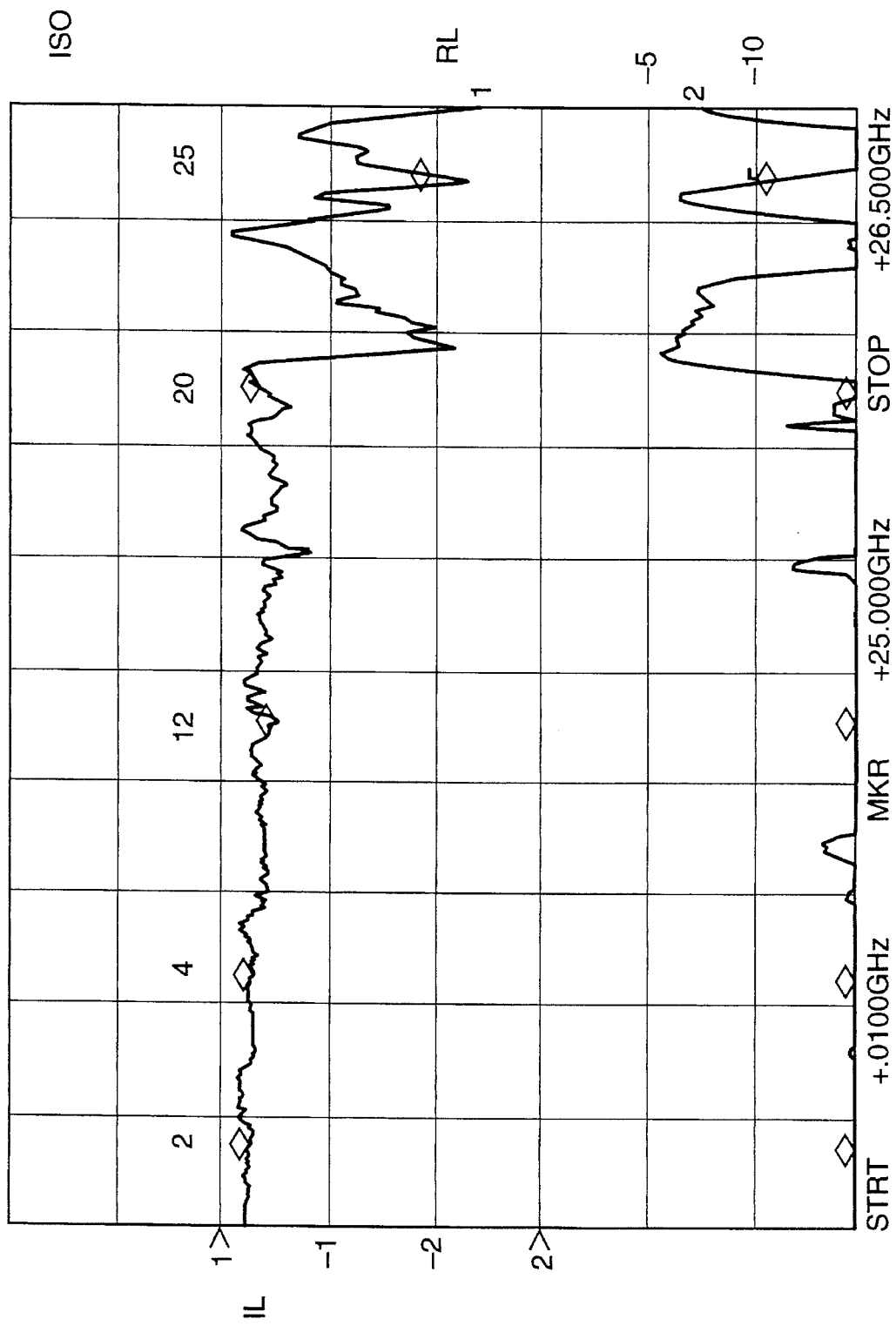
FIG. 10 shows the insertion and return loss performance of the embodiment of the present invention shown in FIG. 9.
Figure 11:
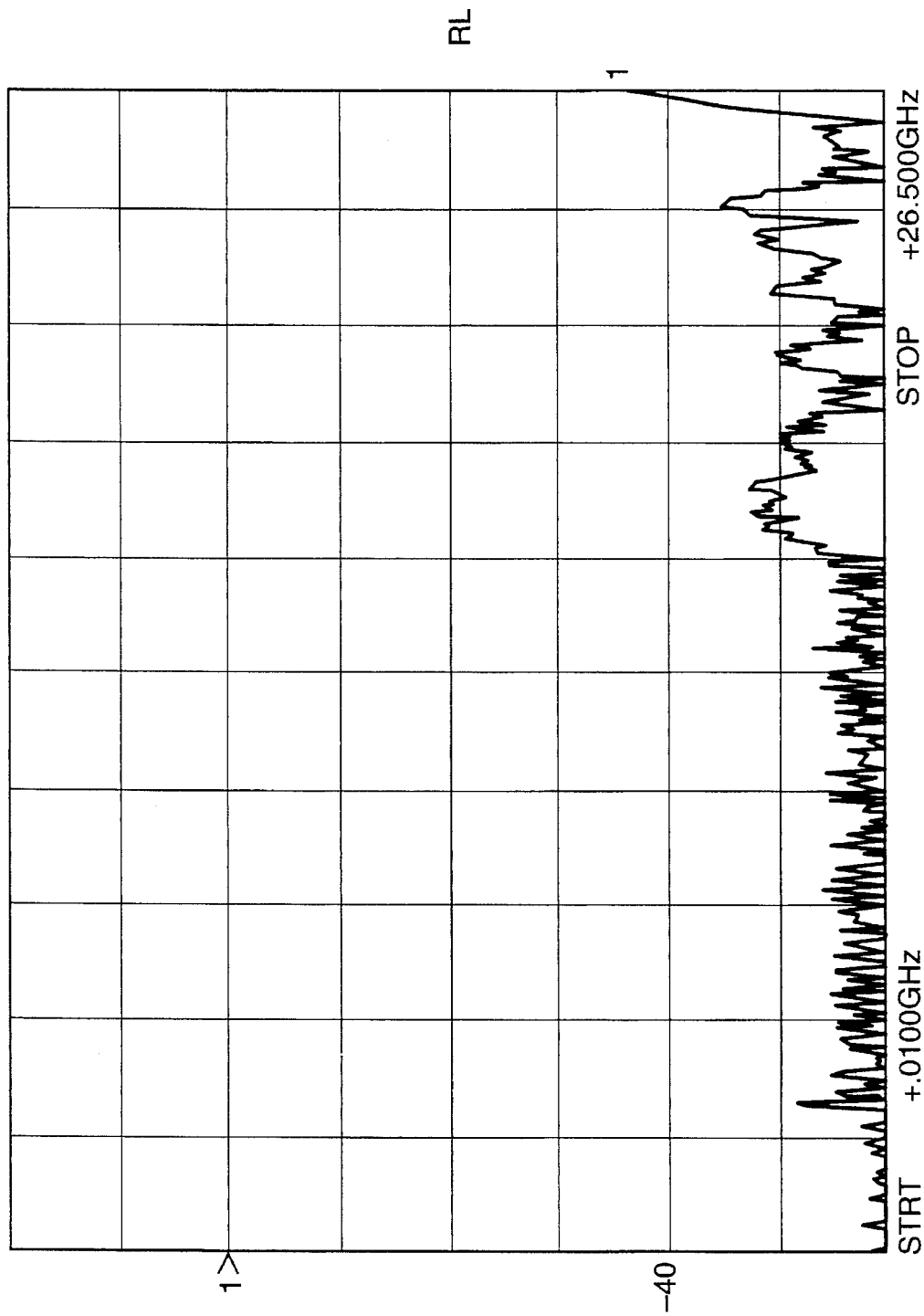
FIG. 11 shows the isolation performance of the embodiment of the present invention shown in FIG. 9.
Figure 12:
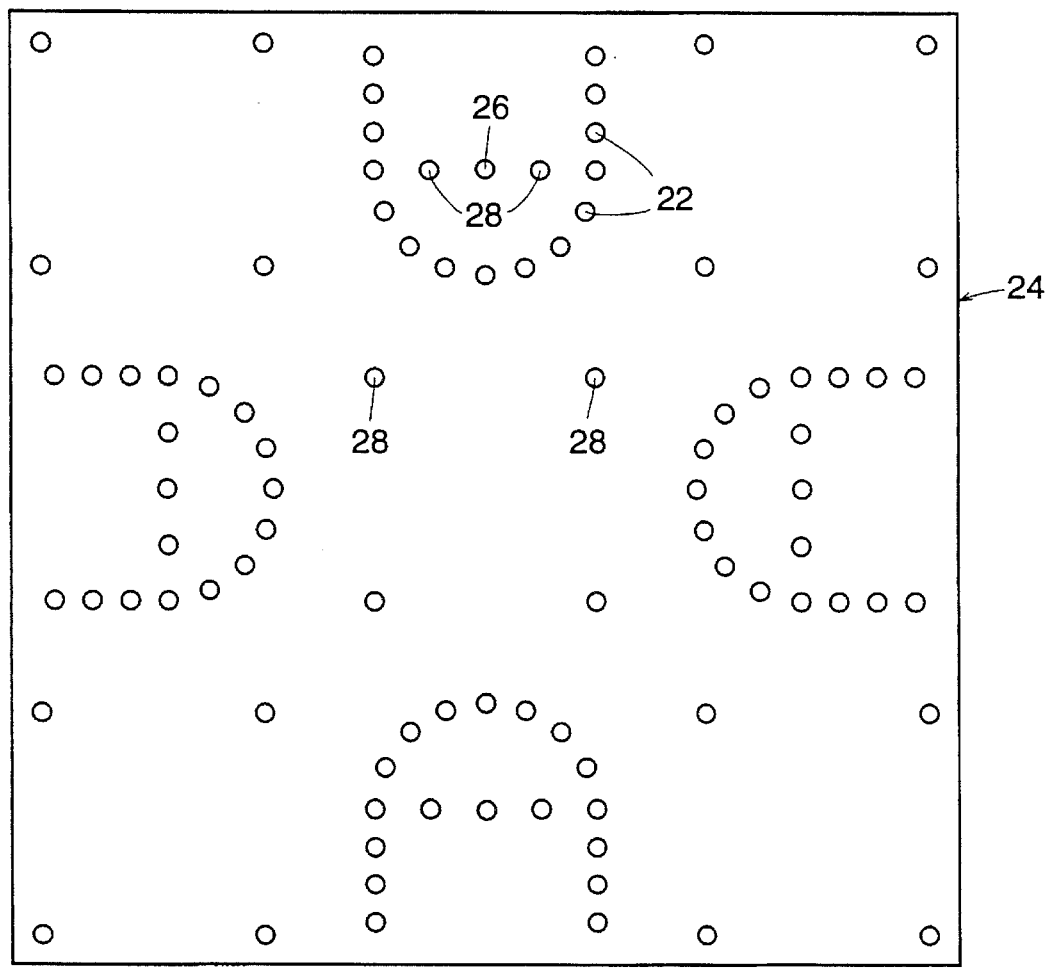
FIG. 12 shows an alternative embodiment of the present invention wherein ground vias are located within the U-shaped via.

FIGS. 9–11 show an alternative embodiment of the present invention, and performance characteristics up to 26.5 GHz for this embodiment. As shown in FIG. 9, U-shaped via 22 need not be continuous, but rather may be formed by a series of vias around the transmission via 26. As shown in FIG. 12, ground vias 28 may be located within the U-shaped via 22, if desired.

Although the present invention has been described with respect to utilizing U-shaped vias to reduce losses in a surface mount package, those skilled in the art would realize the applicability of the present invention to other types of electrical devices. For example, any semiconductor device having a transmission line passing through a substrate, wherein electrical interference is a problem could be modified through the addition of a U-shaped or round via around the transmission line. Furthermore, while it has been found that a U-shaped via is preferable, it is foreseen that other shaped vias around the transmission via may also provide beneficial interference and loss reduction and are within the scope of the present invention as defined in the following claims.

What is claimed is:

1. A method of fabricating a device for allowing a signal to pass through a substrate with reduced electrical losses and interference, said method comprising:

fabricating an insulating substrate having first and second opposed surfaces;

drilling a lead via hole through said insulating substrate from said first surface to said second surface;

drilling a U-shaped via through said insulating substrate from said first surface to said second surface, said U-shaped via extending at least partially circumferentially around said lead via hole;

filling said lead via hole with a conductive material, thereby forming a lead via, for allowing a lead carrying said signal to be attached to a first end of said lead via and a second lead for receiving said signal to be attached to a second end of said lead via; and filling said U-shaped via with a conductive material.

2. The method according to claim 1 wherein the step of drilling said U-shaped via comprises drilling a plurality of separate vias in a U-shape around said lead via hole, and the step of filling said U-shaped via comprises filling each of said plurality of separate vias.

3. The method according to claim 1 further comprising the step of patterning an electrically conductive lead frame on said first surface of said substrate and grounding a portion of said lead frame, said U-shaped via being electrically connected to said grounded portion of said lead frame.

4. The method according to claim 3 further comprising the step of patterning a conductive plate on said second surface of said substrate, said plate comprising a hole extending around said lead via for enabling a electrical connection to be made to said lead via, said plate being electrically insulated from said lead via, and wherein said U-shaped via is electrically connected to said plate for grounding said plate.

5. The method according to claim 1 further comprising the step of determining the dimensions of said lead via, said U-shaped via and said substrate by modelling said device as a single wire in a trough.

6. The method according to claim 4 further comprising the step of determining the dimensions of said lead via, said U-shaped via, said lead frame, said plate and said substrate by modelling said device as a single wire in a trough, a coaxial transmission line and a quasi-coaxial transmission line.

7. The method according to claim 1 further comprising the step of drilling a ground hole from said first surface to said second surface and filling said ground hole with a conductive material.

\* \* \* \* \*